(12) United States Patent
Beintner et al.

(10) Patent No.: US 7,737,502 B2
(45) Date of Patent: Jun. 15, 2010

(54) RAISED STI PROCESS FOR MULTIPLE GATE OX AND SIDEWALL PROTECTION ON STRAINED SI/SGOI SRUCTURE WITH ELEVATED SOURCE/DRAIN

(75) Inventors: Jochen Beintner, Wappingers Falls, NY (US); Gary B. Bronner, Stormville, NY (US); Ramachandra Divakaruni, Ossining, NY (US); Byeong Y. Kim, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 373 days.

(21) Appl. No.: 11/351,801

(22) Filed: Feb. 10, 2006

(65) Prior Publication Data
US 2006/0128111 A1 Jun. 15, 2006

Related U.S. Application Data

(62) Division of application No. 10/709,963, filed on Jun. 9, 2004, now Pat. No. 7,037,794.

(51) Int. Cl.
*H01L 27/088* (2006.01)
(52) U.S. Cl. ............... 257/366; 257/397; 257/E29.018; 257/E23.013
(58) Field of Classification Search ................. 257/368, 257/397, E29.018, E23.013
See application file for complete search history.

(56) References Cited

U.S. PATENT DOCUMENTS 3,602,841 A 8/1971 McGroddy 4,665,415 A 5/1987 Esaki et al.
4,853,076 A 8/1989 Tsaur et al.

(Continued)

FOREIGN PATENT DOCUMENTS

EP 01/62362 6/1989

(Continued)

OTHER PUBLICATIONS

Rim, et al., "Transconductance Enhancement in Deep Submicron Strained-Si *n*-MOSFETs", International Electron Devices Meeting, 26, 8, 1, IEEE, Sep. 1998.

(Continued)

*Primary Examiner*—Davienne Monbleau
*Assistant Examiner*—Matthew Reames
(74) *Attorney, Agent, or Firm*—Scully, Scott, Murphy & Presser, P.C.; Ian D. MacKinnon, Esq.

(57) ABSTRACT

The present invention provides a strained/SGOI structure that includes an active device region of a relaxed SiGe layer, a strained Si layer located atop the relaxed SiGe layer, a raised source/drain region located atop a portion of the strained Si layer, and a stack comprising at least a gate dielectric and a gate polySi located on another portion of the strained Si layer; and a raised trench oxide region surrounding the active device region. The present invention also provides a method of forming such a structure. In the inventive method, the gate dielectric is formed prior to trench isolation formation thereby avoiding many of the problems associated with prior art processes in which the trench oxide is formed prior to gate dielectric formation.

10 Claims, 5 Drawing Sheets

U.S. PATENT DOCUMENTS

| | | |
|---|---|---|
| 4,855,245 A | 8/1989 | Neppl et al. |
| 4,881,105 A | 11/1989 | Davari et al. |
| 4,952,524 A | 8/1990 | Lee et al. |
| 4,958,213 A | 9/1990 | Eklund et al. |
| 5,006,913 A | 4/1991 | Sugahara et al. |
| 5,060,030 A | 10/1991 | Hoke |
| 5,079,180 A * | 1/1992 | Rodder et al. ............... 438/297 |
| 5,081,513 A | 1/1992 | Jackson et al. |
| 5,108,843 A | 4/1992 | Ohtaka et al. |
| 5,134,085 A | 7/1992 | Gilgen et al. |
| 5,310,446 A | 5/1994 | Konishi et al. |
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy et al. |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,801,081 A | 9/1998 | Warashina et al. |
| 5,840,593 A | 11/1998 | Leedy |
| 5,858,825 A | 1/1999 | Alsmeier et al. |
| 5,861,651 A | 1/1999 | Brasen et al. |
| 5,874,328 A | 2/1999 | Liu et al. |
| 5,880,040 A | 3/1999 | Sun et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,110,787 A * | 8/2000 | Chan et al. ............... 438/300 |
| 6,117,722 A | 9/2000 | Wuu et al. |
| 6,133,071 A | 10/2000 | Nagai |
| 6,165,383 A | 12/2000 | Chou |
| 6,184,105 B1 | 2/2001 | Liu et al. |
| 6,197,657 B1 | 3/2001 | Tsukamoto |
| 6,221,735 B1 | 4/2001 | Manley et al. |
| 6,228,694 B1 | 5/2001 | Doyle et al. |
| 6,246,095 B1 | 6/2001 | Brady et al. |
| 6,248,643 B1 | 6/2001 | Hsieh et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,333,242 B1 | 12/2001 | Hwang et al. |
| 6,350,662 B1 | 2/2002 | Thei et al. |
| 6,358,801 B1 | 3/2002 | Fazan et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | Von Ehrenwall |
| 6,476,462 B2 | 11/2002 | Shimizu et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,583,000 B1 | 6/2003 | Hsu et al. |
| 6,881,635 B1 * | 4/2005 | Chidambarrao et al. ..... 438/300 |
| 7,019,364 B1 * | 3/2006 | Sato et al. ............... 257/347 |
| 2001/0009784 A1 | 7/2001 | Ma et al. |
| 2001/0036709 A1 | 11/2001 | Andrews et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2002/0094649 A1 | 7/2002 | Arthanari et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0119257 A1 | 6/2003 | Dong et al. |
| 2003/0141548 A1 | 7/2003 | Anderson et al. |
| 2004/0142537 A1 * | 7/2004 | Lee et al. ............... 438/424 |

FOREIGN PATENT DOCUMENTS

| | | |
|---|---|---|
| EP | 0 967 636 A2 | 12/1999 |
| EP | 1 174 928 A1 | 1/2002 |
| WO | WO 94/27317 | 5/1993 |
| WO | WO 02/454156 A2 | 6/2002 |

OTHER PUBLICATIONS

Rim, et al. "Characteristics and Device Design of Sub-100 nm Strained Si N- and PMOSFETs", 2002 Symposium On VLSI Technology Digest of Technical Papers, IEEE, pp. 98-99.

Scott, et al. "NMOS Drive Current Reduction Caused by Transistor Layout and Trench Isolation Induced Stress", International Electron Devices Meeting, 34.4.1, IEEE, Sep. 1999.

Ootsuka, et al. "A Highly Dense, High-Performance 130nm node CMOS Technology for Large Scale System-on-a-Chip Application", International Electron Device Meeting, 23.5.1, IEEE, Apr. 2000.

Ito, et al. "Mechanical Stress Effect of Etch-Stop Nitride and its Impact on Deep Submicron Transistor Design", International Electron Devices Meeting, 10.7.1, IEEE, Apr. 2000.

Shimizu, et al. "Local Mechanical-Stress Control (LMC): A New Technique for CMOS-Performance Enhancement", International Electron Devices Meeting, IEEE, Mar. 2001.

Ota, et al. "Novel Locally Strained Channel Technique for high Performance 55nm CMOS", International Electron Devices Meeting, 2.2.1, IEEE, Feb. 2002.

Ouyang, et al. "Two-Dimensional Bandgap Engineering in a Novel Si/SiGe pMOSFETS With Enhanced Device Performance and Scalability", Microelectronics Research Center, pp. 151-154, 2000 IEEE.

Sayama et al., "Effect of <Channel Direction for High Performance SCE Immune pMOSFET with Less Than 0.15um Gate Length"ULSI Development Center, pp. 27.5.1-27.5.4, 1999 IEEE.

* cited by examiner

RAISED STI PROCESS FOR MULTIPLE GATE OX AND SIDEWALL PROTECTION ON STRAINED SI/SGOI SRUCTURE WITH ELEVATED SOURCE/DRAIN

RELATED APPLICATIONS

This application is a divisional of U.S. application Ser. No. 10/709,963, filed Jun. 9, 2004 now U.S. Pat. No. 7,037,794.

FIELD OF THE INVENTION

The present invention relates to semiconductor devices, and more particularly to a strained Si/silicon germanium-on-insulator (SGOI) structure having an elevated source/drain region and a raised trench isolation region. The present invention also relates to a method of fabricating such a strained Si/SGOI structure.

BACKGROUND OF THE INVENTION

Improvements in transport properties, i.e., carrier mobility, through strain have been demonstrated in the operating characteristics of field effect transistors (FETs). For complementary metal oxide semiconductor (CMOS) devices, an improvement in device characteristics through carrier mobility has significant potential for the fabrication of very high-speed devices. Strained silicon on a relaxed SiGe substrate is one system where such an improvement occurs.

Experimental research on enhanced carrier mobility MOSFETs caused by strain has concentrated on a strained Si layer grown on a relaxed SiGe layer that is located on a bulk semiconductor wafer. MOSFETs fabricated using a strained Si/SiGe system exhibit the following disadvantages: (1) High source/drain junction leakage—the FET source/drain junctions, as well as the channel region, are formed in a strained Si area resulting in higher junction leakage. (2) The Si/SiGe system MOSFET process is not compatible with mainstream CMOS fabrication techniques requiring specially prepared substrates using molecular beam epitaxy. (3) The Si/SiGe system MOSFET process is costly with low production rate.

In addition to the above mentioned drawbacks with strained Si/relaxed SiGe/bulk wafer structures, prior art structures including strained Si formed on a SiGe-on-insulator (SGOI) template (also referred to herein as a strained Si/SGOI structure) exhibit the following unique problems:

(A) Loss of trench isolation oxide during a multiple gate oxide thickness process (which requires an oxide wet etch selectively with the resist mask, adding trench isolation height). A wider range of trench isolation height requires more etching of the polySi gate resulting in potential gate oxide punchthrough.

(B) A trench isolation divot forms at the strained Si/trench isolation interface. This can create a short circuit between the strained Si islands due to a gate polySi stringer.

(C) A chemical mechanical polishing (CMP) uniformity restriction is imposed or a narrow process window is obtained.

(D) A narrow polySi gate over etching window.

(E) A limitation of thermal budget during pad oxide growth.

(F) Strained Si sidewall exposure and Si loss.

In view of the drawbacks mentioned with the prior art, there is a need for providing a new and improved method of fabricating a strained Si/SGOI structure that overcomes the aforementioned issues recited under items (A)-(F).

SUMMARY OF THE INVENTION

The present invention resolves the problems with the prior art method mentioned above by reversing the process sequence of gate dielectric and trench isolation formation. In a conventional process, the gate dielectric, i.e., oxide, is formed after formation of the trench isolation region, restricting the amount of trench dielectric oxide removal during the multiple gate oxide processing. In the prior art process, an oxide divot is typically formed in the strained Si/SGOI structure, which can result in a short circuit with a neighboring active area when a polySi stringer is present in the divot.

In the present invention, the gate formation process can be done without any restriction of oxide removal. Hence, items (A), (B) and (E) mentioned above are resolved. Moreover, the gate polySi top surface is planarized in the present invention by a two step gate poly deposition (before and after trench isolation) thereby eliminating unnecessary poly over etching. Also, the inventive structure allows for a higher trench isolation height as compared to the conventional process. Hence, the present invention resolves the issues mentioned under items (C)-(D) above. Furthermore, due to the higher trench isolation height that can be achieved in the present invention, a disposable nitride spacer can be employed which protects the sidewalls of the strained Si thereby resulting in little or no Si loss at the isolation trench edge.

In broad terms, the present invention provides a method of fabricating a strained Si/SGOI structure that comprises the steps of:

providing a structure including a silicon germanium-on-insulator (SGOI) substrate, a strained Si layer atop the SGOI substrate, a gate dielectric atop the strained Si layer, a gate polySi atop the gate dielectric and a pad nitride atop the gate dielectric;

forming a first stack of said pad nitride, said gate polySi, said gate dielectric, said strained Si, and a relaxed SiGe layer of the SGOI substrate;

forming a trench oxide in regions adjacent to said first stack;

removing said pad nitride from said first stack to expose said gate polySi layer;

forming a material layer comprising a polySi layer, an insulator, such as an oxide, and a cap nitride on said exposed gate polySi layer and said trench oxide, said polySi layer is in contact with said gate polySi layer;

forming a second stack comprising said cap nitride, said insulator, said polySi layer, and said gate polySi layer, said second stack is located atop said gate dielectric; and forming a raised source/drain region on said strained Si layer in regions adjacent to said second stack, wherein during said forming exposed sidewalls of the trench oxide are protected with a sacrificial nitride spacer.

In some embodiments, and during the forming of the first stack, the relaxed SiGe layer can be etched so that a recess region is formed beneath the strained Si layer.

Following the formation of the raised source/drain region, the sacrificial nitride spacers are removed forming voids in the structure that can be subsequently filled with a nitride fill material. Oxide spacers are then formed about the second stack.

In addition to the above method, the present invention also relates to the strained Si/SGOI structure that is formed by performing the aforementioned processing steps. In broad terms, the inventive strained Si/SGOI structure comprises:

an active device region comprising a relaxed SiGe layer, a strained Si layer located atop the relaxed SiGe layer, a raised source/drain region located atop a portion of said strained Si layer, and a stack comprising at least a gate dielectric and a gate polySi located on another portion of the strained Si layer; and a raised trench oxide region surrounding said active device region.

DETAILED DESCRIPTION OF THE INVENTION

The present invention, which provides a strained Si/SGOI structure having an elevated source/drain region and a raised trench isolation region and a method of fabricating the same, will now be described in greater detail by referring to drawings that accompany the present application.

Figure 1A:
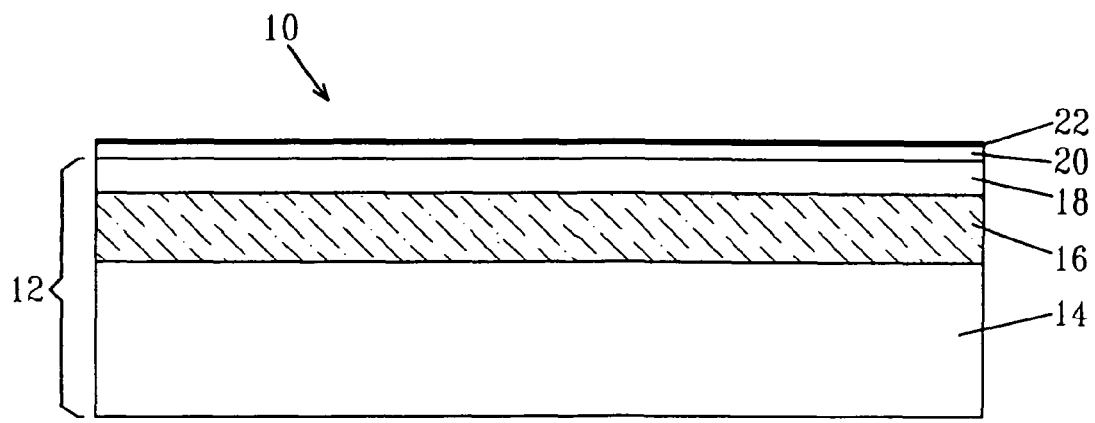
FIGS. 1A-1K are pictorial representations (through cross sectional views) illustrating the basic processing steps employed in one embodiment of the present invention.

Reference is first made to FIG. 1A, which illustrates an initial structure 10 that is employed in the present invention. The initial structure 10 comprises a SiGe-on-insulator (SGOI) substrate 12, a strained Si layer 20 located on a surface of the SGOI substrate 12, and a gate dielectric 22 located on a surface of the strained Si layer 20. As shown, the SGOI substrate 12 includes a Si-containing substrate layer 14, an insulating layer 16, and a SiGe layer 18 that is in a relaxed state.

The SGOI substrate 12 can be fabricated using any conventional process in which a relaxed SiGe layer is formed atop a surface of an insulating layer. In one embodiment, for example, the SGOI substrate 12 can be formed by thermally growing a SiGe layer, which is relatively thick, on a silicon-on-insulator (SOI) layer of a SOI substrate and then relaxing the SiGe layer by annealing/oxidation.

In another embodiment, for example, the SGOI substrate 12 can be formed by wafer bonding and/or by oxygen ion implantation.

Co-assigned U.S. application Ser. No. 10/662,028, filed Sep. 12, 2003, the entire content of which is incorporated herein by reference, discloses yet another possible way in which the SGOI substrate 12 can be fabricated. In accordance with U.S. Ser. No. 10/662,028, a structure comprising a Si-containing substrate having a hole-rich region and a Ge layer located thereon is first provided. Next, the hole rich region is converted into a porous region utilizing an anodization process and then the structure is annealed such that the porous region is converted into a buried oxide region, while simultaneously forming a relaxed SiGe alloy layer atop the buried oxide. In yet another method, a thermal mixing process such as described, for example, in co-assigned U.S. application Ser. No. 10/448,947, filed May 30, 2003, co-assigned U.S application Ser. No. 10/055,138, and co-assigned U.S. application Ser. No. 10/669,601, filed Oct. 29, 2003 can be used in forming the SGOI substrate; the entire content of each of the aforementioned U.S. Applications is incorporated herein by reference. In the thermal mixing process, ions such as oxygen are first implanted into a Si-containing substrate to form an implanted ion rich region. Next a Ge-containing layer such as a SiGe alloy or pure Ge, is formed atop the implanted structure, and then the structure is annealed under conditions that permit the formation of a Ge diffusion barrier in the Si-containing substrate, while simultaneously causing interdiffusion (and hence intermixing) of Si and Ge forming a relaxed SiGe layer atop the Ge diffusion barrier.

Notwithstanding which process is employed in fabricating the SGOI substrate, the relaxed SiGe layer 18 typically has a thickness from about 20 to about 80 nm, with a thickness from about 30 to about 50 nm being more typical. The term "relaxed SiGe layer" denotes a SiGe layer that has a measured degree of relaxation of about 35% or greater, preferably 50 or greater. The term "SiGe" denotes a SiGe alloy having a Ge content between 0 to 100 atomic percent, with a Ge content from about 10 to about 50 atomic percent being more typical.

The insulating layer 16 of the SGOI substrate may comprise an oxide, nitride, oxynitride or any combination thereof, with an oxide being most typical. The insulating layer 16 typically has a thickness from about 50 to about 300 nm, with a thickness from about 100 to about 150 nm being more typical. The thickness of the Si-containing substrate layer 14 is not critical to the present application and can vary over a wide range of thicknesses.

Stained Si layer 20 is formed atop the SGOI substrate 12, particularly on the relaxed SiGe layer 18, by an epitaxial deposition process well-known to those skilled in the art. The thickness of the strained Si layer 20 may vary, but typically, the strained Si layer 20 has a thickness from about 1 to about 100 nm. Because the relaxed SiGe layer 18 of the SGOI substrate 12 has a large in-plane lattice parameter as compared to the epi Si layer 20 formed thereon, the epi Si layer 20 will be strained in a tensile manner.

The gate dielectric 22, which is located atop the strained Si layer 20, comprises an oxide such as, for example, $SiO_2$, $TiO_2$, $HfO_2$, $ZrO_2$, $Al_3O_4$, mixed oxides such as perovskite-type oxides and the like. In a preferred embodiment, gate dielectric 22 comprises $SiO_2$, or a nitrogen rich thermal oxide. The gate dielectric 22 can be formed by a deposition process such as, for example, chemical vapor deposition (CVD), plasma-enhanced chemical vapor deposition (PECVD), evaporation, chemical solution deposition, or atomic layer deposition (ALD). Alternatively, the gate dielectric 22 can be formed by a thermal oxidation process as well as a thermal oxidation under a nitrogen-containing environment. In a preferred embodiment in which $SiO_2$ is employed as the gate dielectric 22, thermal oxidation is used in forming the gate oxide. In some instances, typical nitrogen enriched technology such as plasma nitridation can be used in conjunction with thermal oxidation. When a thermal oxidation process is employed, the surface of the strained Si is typically cleaned with a conventional cleaning agent prior to thermal deposition of the oxide.

The thickness of the gate dielectric 22 formed atop the strained Si layer 20 may vary depending on the process used in forming the same as well as the type of insulator employed. Typically, however, the gate dielectric 22 has a thickness from about 0.5 to about 10 nm, with a thickness from about 1 to about 3 nm being even more typical.

It is noted that prior to formation of the gate dielectric 22, various implants such as a well implant and a channel implant (both not shown) can be performed. The well implant, which typically forms a well region (not shown) within the relaxed SiGe layer 18, is carried out using a conventional ion implantation process well known to those skilled in the art. P- or N-type dopants can be used in forming the well region. Likewise, the channel implant, which forms a channel region (not shown) within the strained Si layer 20, is performed using a conventional ion implantation process that is also well known to those skilled in the art. The channel implant can be performed using N- or P-type dopants.

It is emphasized that the above processing occurs on an unpatterned structure that does not contain any trench isolation regions. Since the above process is performed first prior to trench isolation formation, there is no restriction on the amount of oxide removal which typically occurs in the prior art when the trench isolations are formed prior to gate dielectric formation. The multiple gate oxide process requires different amounts of oxide removal depending on the device location in prior art, including STI (shallow trench isolation) height variation. However, this invention is free from the STI variation because the trench isolation region is not formed yet. Since there is no pattern used at this point of the present invention, an alignment key formation process may be required in some instances. The alignment key formation process includes depositing a CVD oxide on the strained Si surface, followed by lithography and a wet oxide etch process.

In accordance with the present invention, the structure at this point of the present invention will have a multiple gate thickness on the strained Si layer 20 with a variety of channel implantation on different areas within the structure.

Figure 1B:
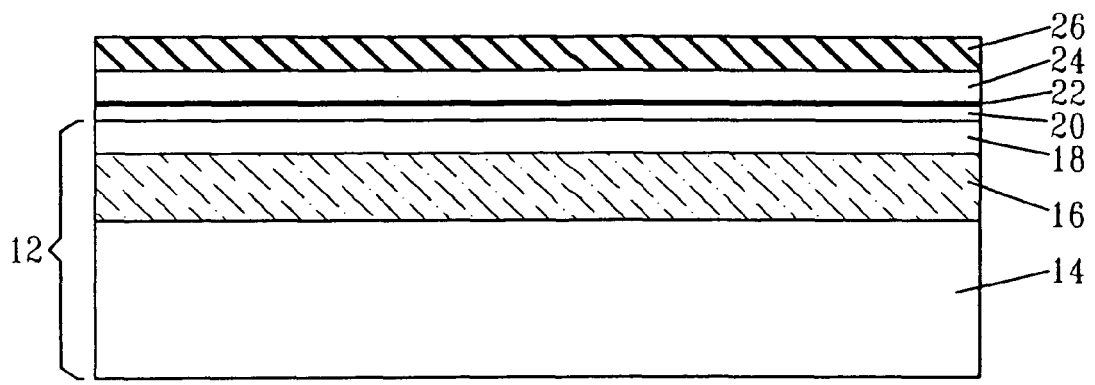

Next, and as shown in FIG. 1B, a gate polySi (i.e., first polySi layer) 24 and a pad nitride layer 26 are formed on the initial structure 10 shown in FIG. 1A. Specifically, a layer of gate polySi 24 is formed on the surface of the gate dielectric 22 by a conventional deposition process including, for example, CVD, PECVD, evaporation, chemical solution deposition, ALD, and other like deposition processes. The gate polySi 24 formed at this point of the present invention has a thickness from about 50 to about 300 nm, with a thickness from about 100 to about 150 nm being more typical.

Pad nitride layer 26 is formed atop the gate polySi 24 by a deposition process such as CVD, PECVD, evaporation, chemical solution deposition and the like. The pad nitride layer 26 formed at this point of the present invention has a thickness from about 10 to about 100 nm, with a thickness from about 20 to about 50 nm being more typical.

It is noted that in the inventive process no pad oxide layer is employed. Instead, the pad oxide layer is replaced in the present invention by the combination of the gate dielectric 22 and the gate polySi 24. Various kinds of ions can be implanted into the gate polySi 24 depending on the circuit requirement before the pad nitride 26 deposition. It is also worth while pointing out the gate polySi 24 formed at this step of the present invention is confined to the active device area of the structure. A gate polySi layer can be formed atop the trench isolation (to be subsequently formed) during formation of self-aligned silicide contacts.

Figure 1C:
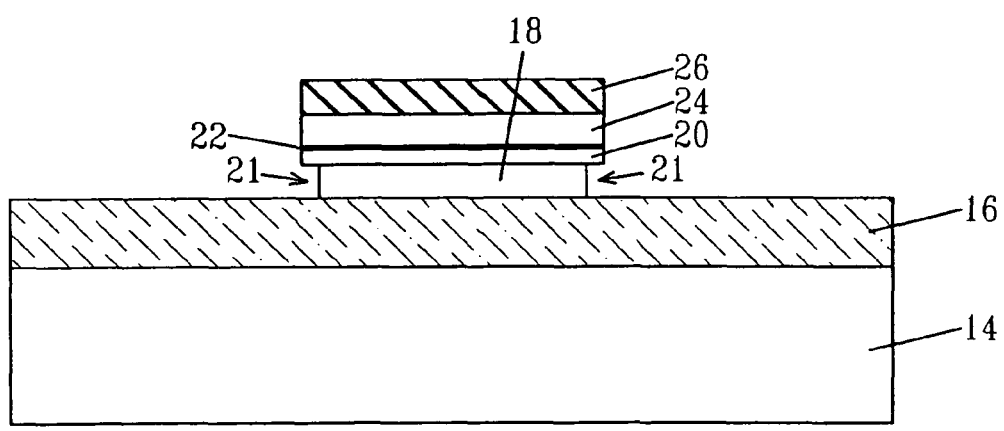

The structure shown in FIG. 1B is then patterned by lithography and etching so as to provide the patterned structure shown in FIG. 1C. Specifically, the lithography and etching patterns the pad nitride layer 26, the gate polySi layer 24, the gate dielectric 22 as well as the stained Si layer 20 and the relaxed SiGe layer 18 into a first stack. The etching step employed in the present invention can have a lateral undercut or recess region 21 in the relaxed SiGe layer 18 beneath the strained Si layer 20.

The lithography step employed at this point of the present invention comprises applying a photoresist (not shown) to the surface of the pad nitride layer 26, exposing the photoresist to a pattern of radiation, and developing the pattern into the photoresist using a conventional resist developer. The lithographic step forms a patterned photoresist atop a predetermined portion of the pad nitride layer 26. The exposed regions, not including the patterned photoresist, are then etched using at least one etching step, stopping atop the insulating layer 16. The at least one etching step includes a dry etch process such as reactive-ion etching (RIE), ion beam etching, plasma etching, or laser ablation, a wet etching process, or any combination thereof. In a preferred etching scheme, the pad nitride layer 26 is first etched and then the patterned photoresist is stripped using a conventional stripping process. The patterned nitride layer 26 is then used as a mask for etching the underlying layers forming the first stack atop the insulating layer 16.

The total thickness of the pad nitride layer 26 and the gate polySi 24 employed is typically similar or thicker than a conventional pad nitride layer. In the present invention, the total thickness of the pad nitride layer 26 and the gate polySi 24 is preferred to be thicker than a conventional pad nitride layer so as to be able to protect the sidewalls of the strained Si layer 20 during subsequent wet/dry etch processing to complete the final structure. Considering photoresist thickness restriction with a small ground rule, an oxide hard mask (not shown) can be used in the present invention, allowing a much thinner resist thickness than a conventional resist process. When an oxide hard mask is employed, it is typically formed atop the pad nitride layer 26 prior to lithography. Note that the pad nitride thickness is typically decided in the prior art by the height of the trench isolation regions. However, in the present invention, the trench isolation height is related to the sum of the pad nitride and polySi gate, allowing the use of a much thinner pad nitride layer than a conventional process.

Figure 1D:
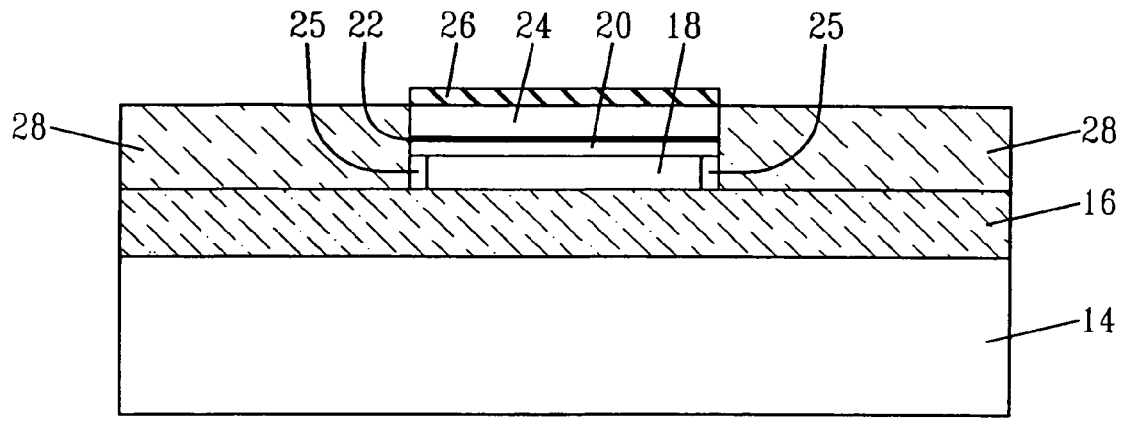

Next, a trench oxide 28 such as tetraethylorthosilicate (TEOS) or a high density plasma oxide is formed atop the exposed surface of the insulating layer 16, and the trench oxide 28 is then planarized by chemical mechanical polishing or grinding to provide the structure shown, for example, in FIG. 1D. A single or multiple deposition can be employed in the present invention in forming trench oxide 28. Trench oxide 28 forms the raised trench isolation regions of the inventive structure in regions adjacent to the first stack provided above. Note that the pad nitride layer 26 undergoes a deglazing step after planarizing the trench oxide 28, which causes the pad nitride layer 26 to extend above the upper planarized surface of the trench oxide 28. As shown in FIG. 1D, the recess area 21 is not filled with any material; instead, a void 25 remains in the structure. In some embodiments, an insulating material (not shown) can be used to fill the recess area 21 prior to forming the trench oxide 28.

The pad nitride layer 26 is now removed from the structure using a conventional stripping process that selectively removes nitride as compared to oxide or polySi. After removing the pad nitride layer 26, a polySi layer 30 is formed over the structure using a conventional deposition process. The polySi layer 30 formed at this point of the present invention typically has a thickness after deposition from about 50 to about 200 nm, with a thickness from about 50 to about 100 nm being more typical.

Figure 1E:
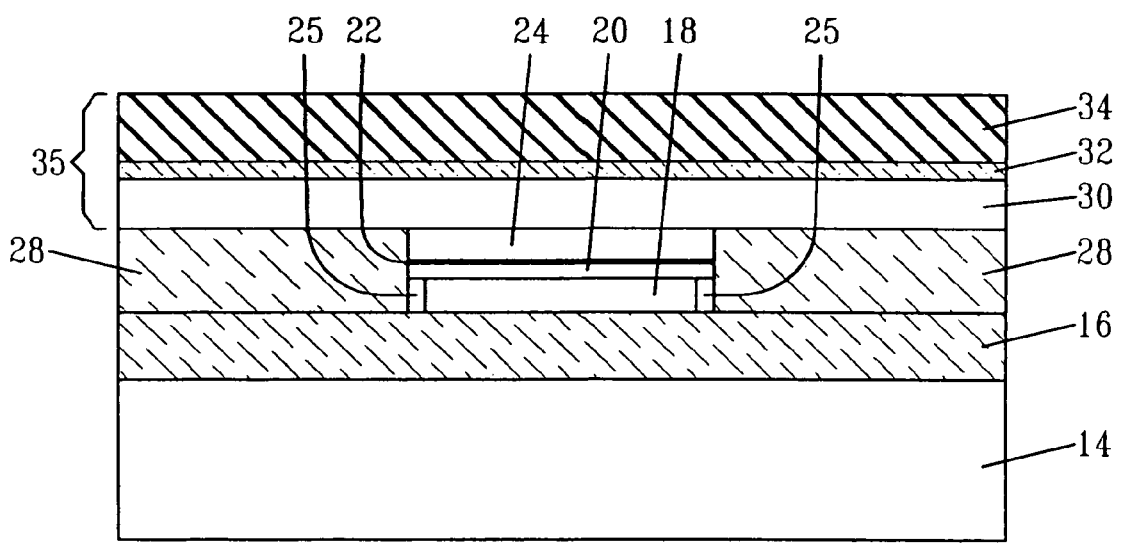

Next, an insulator, such as a high temperature oxide (HTO), 32 is deposited with LPCVD atop the polySi layer 30. The insulator 32 has a thickness that is typically from about 10 to about 100 nm, with a thickness from about 10 to about 50 nm being more typical. Cap nitride 34 is then formed atop the insulator 32 by a conventional deposition process. The cap nitride 34 typically has a thickness from about 20 to about 80 nm, with a thickness from about 30 to about 50 nm being more typical. The resultant structure after pad nitride removal and formation of layers 30, 32, and 34, i.e., material layer 35, is shown in FIG. 1E. Note that in some regions polySi layer 30 is in contact with gate polySi 24.

Since the gate dielectric 22 has been formed prior to trench oxide 28 formation, no oxide is removed from the trench oxide 28, as typically is the case in prior art processes in which the trench oxide is formed prior to gate dielectric formation. Because of the inventive processing sequence, there is no variation in trench oxide height as is the case in the prior art process. Particularly, the inventive processing sequence does not induce trench isolation height variation to the structure.

Figure 1F:
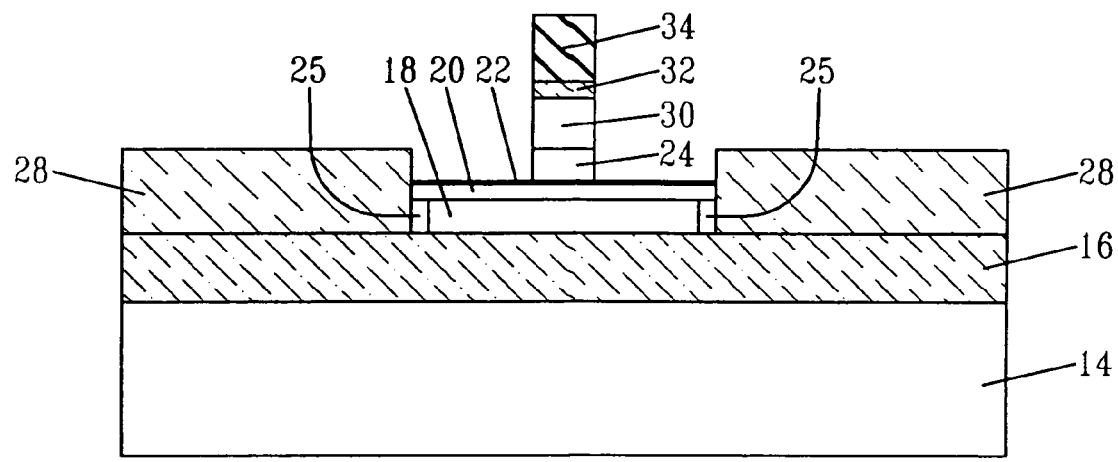

FIG. 1F shows the structure after the nitride cap 34, insulator 32, polySi layer 30 gate and polySi 24 have been patterned via lithography and etching into a second stack. Note that the second stack includes patterned elements from the first stack and it lies atop the gate dielectric 22. The gate dielectric 22 is not etched at this point of the present invention. The lithography and etching steps include the processing described above. Note that no extra gate poly over etching is required in the present invention once the gate polysilicon has been exposed. In the case of the conventional process flow, extra over etching is required (as much as the trench isolation height) since the gate polySi thickness at the interface is thicker than the deposited thickness. In the present invention, however, the maximum gate polySi thickness is the same as the gate polySi thickness of the active region. Once the gate poly on the active area is removed, all other regions are already cleared of polySi. A significant advantage can be obtained when ultra thin (on the order of about 1 nm or less) gate oxides are employed.

Figure 1G:
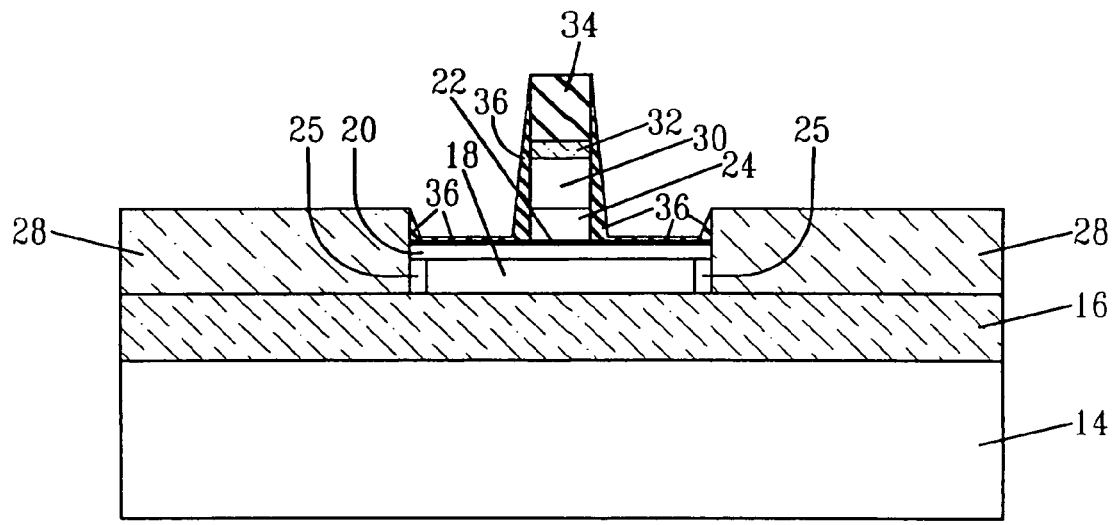

Next, and as shown in FIG. 1G, a sacrificial nitride spacer 36 is formed on exposed sidewalls of the structure shown in FIG. 1F. In particular, a sacrificial nitride spacer 36 is formed on exposed sidewalls of layers 34, 32, 30, 24, 22 and trench oxide 28. The sacrificial nitride spacer 36 is formed by deposition and dry etching.

At this point of the present invention, any gate dielectric 22 not protected by the second stack or the sacrificial nitride spacers 36 is removed to expose underlying surfaces of the strained Si layer 20. A wet etch process can be used to remove the unprotected portions of the gate dielectric 22.

Figure 1H:
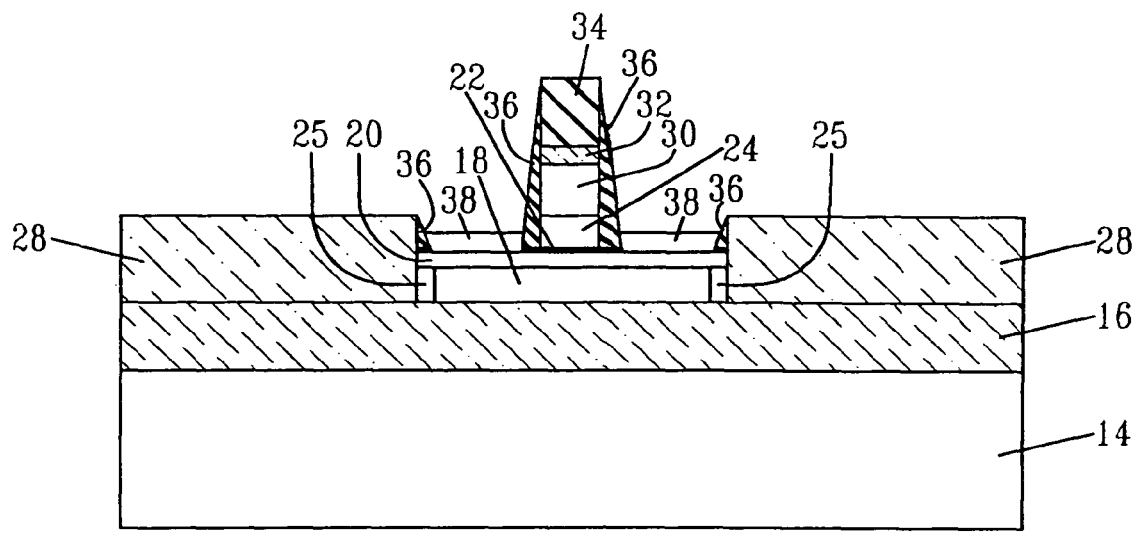

A selective epitaxial Si layer 38, which becomes the elevated source/drain region of the inventive structure, is then formed via a conventional epi growth process atop the exposed surfaces of the strained Si layer 20, see FIG. 1H. Note that the selective epitaxial Si layer 38 growth requires a strong pre-clean which can potentially remove a significant amount of oxide. In the present invention, the sacrificial nitride spacers 36 protect oxide from being removed. Specifically, the spacer 36 prevents the void from being exposed during precleaning. The void, which is formed naturally in this embodiment, is not preferred, but, with spacer 36 in accordance with this invention, can be tolerate.

Figure 1I:
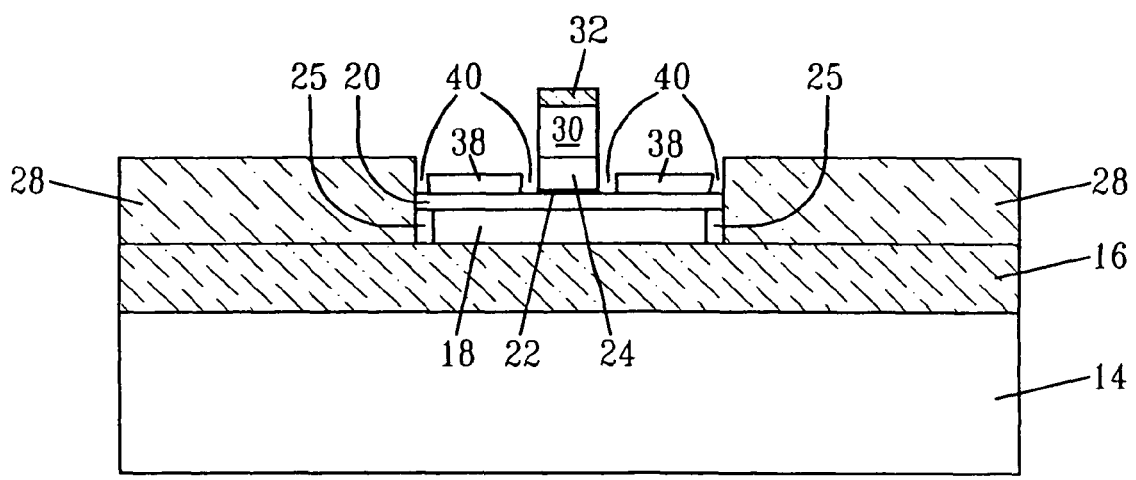

The sacrificial nitride spacers 36 are then removed from the structure utilizing a wet etch process that selectively removes nitride. Note that small voids (or divots) labeled as 40 in FIG. 1I are formed. At this point of the inventive process, any implantation can be performed for device control (e.g., threshold voltage control). Note during the removal of the sacrificial nitride spacers 36, the nitride cap 34 is also removed exposing oxide 32.

Figure 1J:
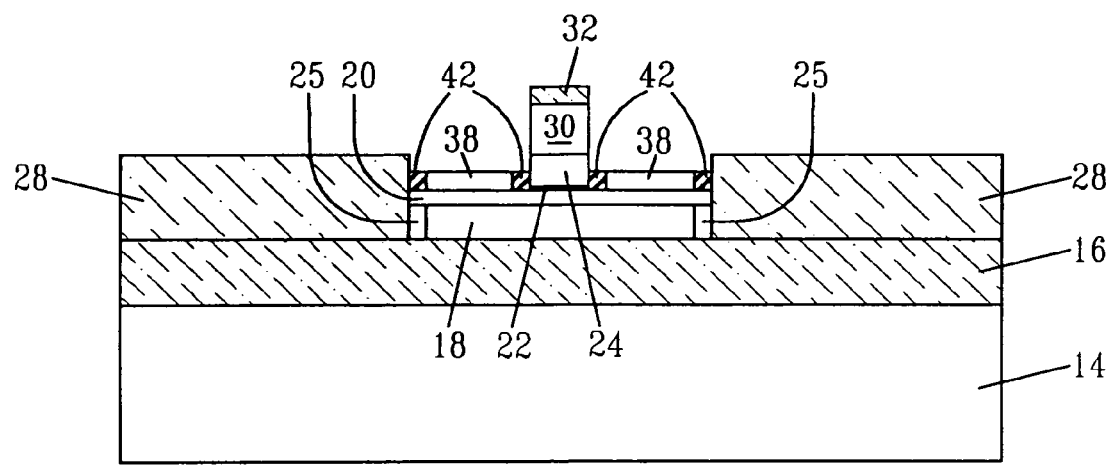

The divots 40 shown in FIG. 1I are then filled with a nitride fill material 42 providing the structure shown in FIG. 1J. The nitride fill material 42 is formed into the divots 40 by depositing a layer of nitride, and wet etching the deposited nitride layer.

Figure 1K:
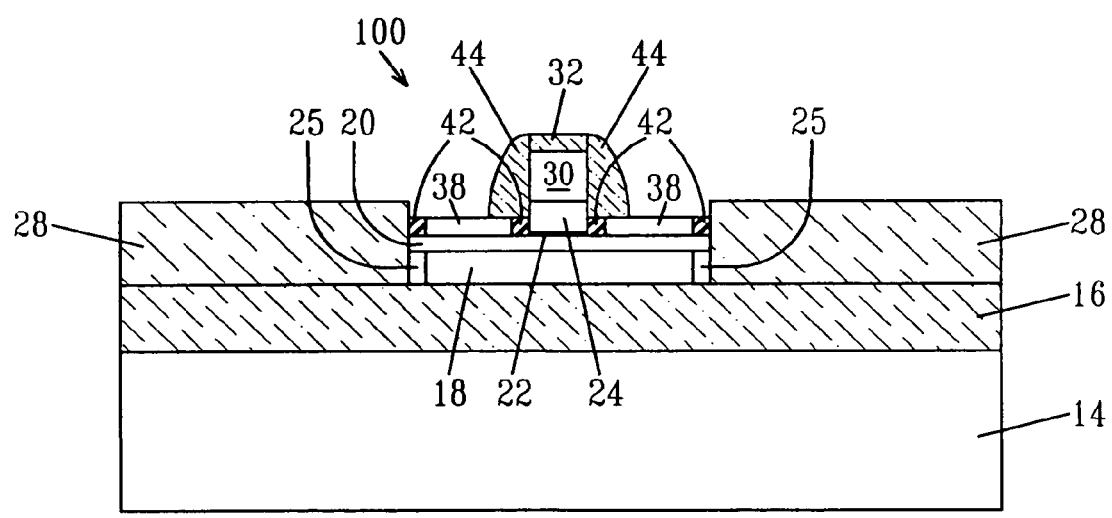

Next, oxide spacers 44 are formed on exposed sidewalls of the oxide 30, and gate polySi 24 by deposition and etching providing the structure shown, for example, in FIG. 1K. Specifically, the structure shown in FIG. 1J includes an active device region 100 comprising relaxed SiGe layer 18, strained Si layer 20 located atop the relaxed SiGe layer 18, a raised source/drain region 38 located atop a portion of said strained Si layer 20, and a second stack comprising at least gate dielectric 22 and gate polySi 24, 30 located on another portion of the strained Si layer 20; and a raised trench oxide region 28 surrounding the active device region 100.

Depending on the transistor performance requirement, multiple disposable spacers can be formed without hurting the philosophy of the invention.

After forming the oxide spacers 44 typical CMOS processing such as silicide contact formation can be performed.

While the present invention has been particularly shown and described with respect to preferred embodiments, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A strained Si/SGOI structure comprising:
   an active device region comprising a relaxed SiGe layer present on a buried insulating layer, in which the buried insulating layer is continuously extending across an entire width of a semiconductor substrate, a strained Si layer is located atop the relaxed SiGe layer, wherein the sidewalls of the relaxed SiGe layer are recessed to provide a void at each sidewall of the relaxed SiGe layer that is not filled with any material, a raised source/drain region located atop a portion of said strained Si layer, and a stack comprising at least a gate dielectric and a gate polySi located on another portion of the strained Si layer; and
   a raised trench oxide region surrounding said active device region, wherein an upper surface of the raised trench oxide region is raised above an upper surface of the raised source/drain region.

2. The strained Si/SGOI structure of claim 1 further comprising an oxide spacer abutting said stack.

3. The strained Si/SGOI structure of claim 1 wherein said raised source/drain region is separated from said stack and said raised trench oxide by nitride.

4. The strained Si/SGOI structure of claim 1 wherein said strained Si layer is in contact with said raised trench oxide region.

5. The strained Si/SGOI structure of claim 1 wherein said gate polySi includes two polySi layers.

6. The strained Si/SGOI structure of claim 1 wherein said gate dielectric is an oxide or an oxide containing nitrogen therein.

7. The strained Si/SGOI structure of claim 1 wherein said gate dielectric is a thermal $SiO_2$ layer.

8. The strained Si/SGOI structure of claim 1 wherein said relaxed SiGe layer is an upper layer of a SGOI substrate, which further includes the buried insulating layer, the buried insulating layer having said raised trench oxide region located thereon.

9. The strained structure of claim 1 wherein an oxide cap is present on said gate polySi.

10. A strained Si/SGOI structure comprising an active device region comprising a relaxed SiGe layer present on a buried insulating layer, in which the buried insulating layer is continuously extending across an entire width of a semiconductor substrate, a strained Si layer is located atop the relaxed SiGe layer, wherein the sidewalls of the relaxed SiGe layer are recessed to provide a void at each sidewall of the relaxed SiGe layer that is not filled with any material, a raised source/drain region located atop a portion of said strained Si layer, and a stack comprising at least a gate dielectric and a gate polySi located on another portion of the strained Si layer; and a raised trench oxide region surrounding said active device region, wherein an upper surface of the raised trench oxide region is raised above an upper surface of the raised source/drain region, in which the void is present between the relaxed SiGe layer and the raised trench oxide region.

* * * * *